US005550324A

United States Patent [19]

Black et al.

[11] Patent Number: 5,550,324
[45] Date of Patent: Aug. 27, 1996

[54] ENVIRONMENTAL SEALING SYSTEM FOR ELECTRONIC INSTRUMENTS

[75] Inventors: Michael J. Black; Keith S. Willows, both of Seattle; William P. Stiles, Bothell; Patrick M. Gallagher, Seattle, all of Wash.

[73] Assignee: Fluke Corporation, Everett, Wash.

[21] Appl. No.: 393,550

[22] Filed: Feb. 23, 1995

[51] Int. Cl.⁶ ..................................................... H05K 5/06
[52] U.S. Cl. .......................................... 174/52.3; 277/901
[58] Field of Search ........................... 174/50, 52.1, 52.3, 174/35 R, 35 GC; 277/901; 361/816, 818

[56] References Cited

U.S. PATENT DOCUMENTS

| | | | |
|---|---|---|---|
| 4,700,468 | 10/1987 | Volkhin et al. | 29/623.2 |
| 5,120,903 | 6/1992 | Tam | 174/35 GC |
| 5,187,621 | 2/1993 | Tacklind | 360/97.02 |
| 5,252,782 | 10/1993 | Cantrell et al. | 174/35 R |
| 5,294,748 | 3/1994 | Schwenk et al. | 174/35 R |
| 5,430,607 | 7/1995 | Smith | 361/683 |
| 5,462,820 | 10/1995 | Tanaka | 429/174 |
| 5,479,285 | 12/1995 | Burke | 359/83 |
| 5,483,423 | 1/1996 | Lewis et al. | 361/816 |

*Primary Examiner*—Kristine L. Kincaid
*Assistant Examiner*—Robert J. Decker
*Attorney, Agent, or Firm*—Seed and Berry LLP

[57] ABSTRACT

An environmentally sealed electronic test instrument having a three-part case enclosing an electronic testing circuit of conventional design. The three parts are open-ended top and bottom parts, and an end part covering the open ends of the top and bottom parts. The top and bottom parts have adjoining sidewalls between which is positioned a first resilient seal. Respective inwardly extending flanges are formed at the open ends of the top and bottom parts. The flanges are received by a second, U-shaped seal that is, in turn, received by a U-shaped channel formed along a marginal edge of the end plate. A pair of fingers integrally formed in the second gasket project into the U-shaped channel and are positioned between the first seal and top part of the case. The side marginal edge of the bottom part of the case are recessed within the sidewall of the top part of the case to enclose the first gasket.

21 Claims, 3 Drawing Sheets

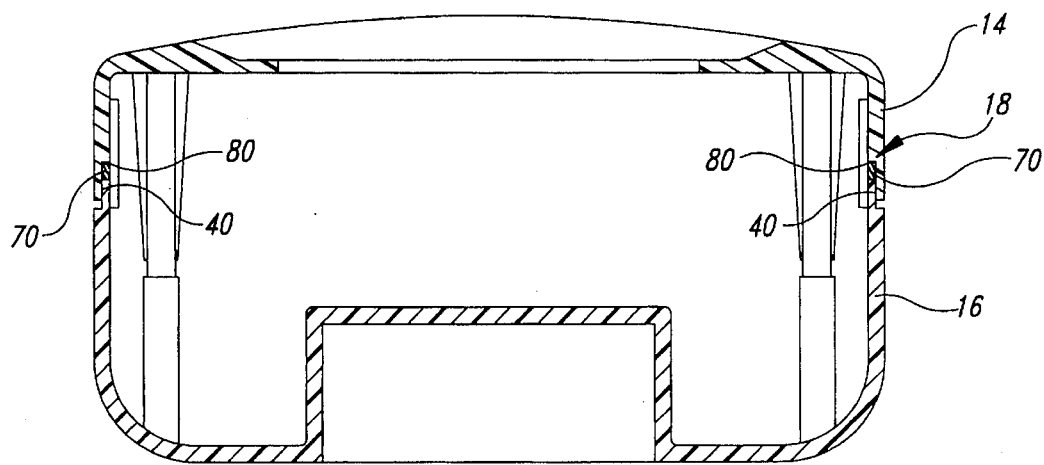
Fig. 3
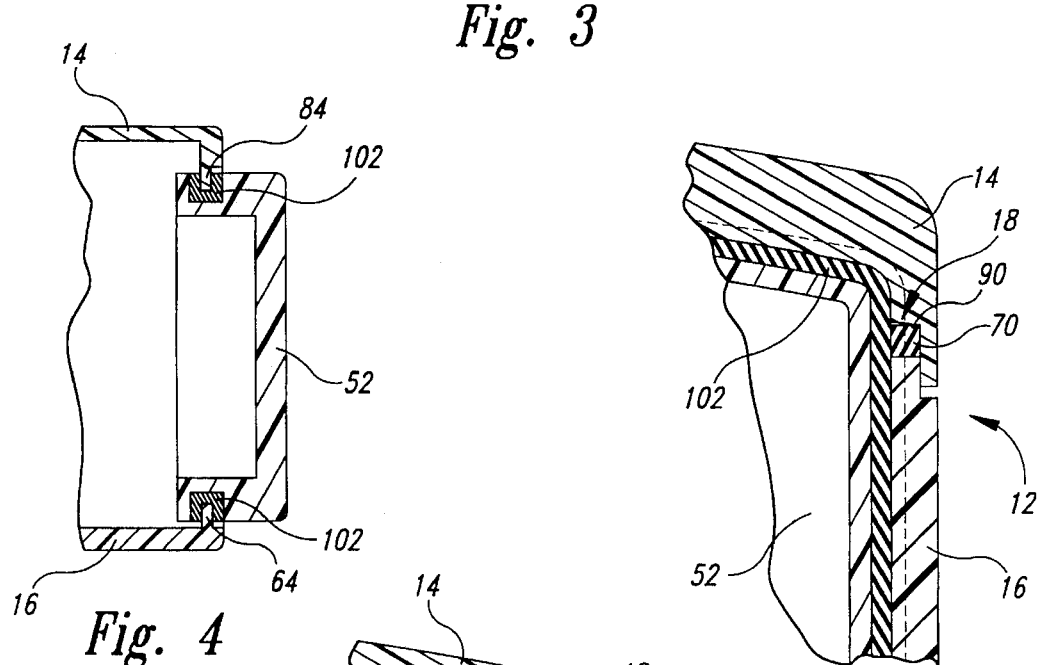
Fig. 4
Fig. 5
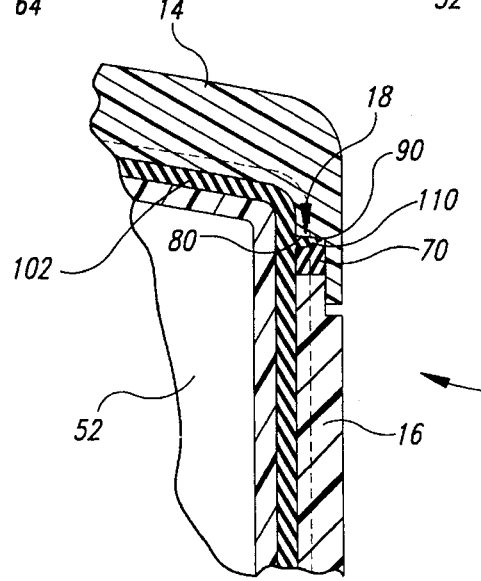
Fig. 6

ENVIRONMENTAL SEALING SYSTEM FOR ELECTRONIC INSTRUMENTS

FIELD OF THE INVENTION

This invention relates to electronic devices and, more particularly, to a system for sealing electronic devices contained within an electronic instrument case from the external environment.

BACKGROUND OF THE INVENTION

There is a common need for electronic devices to be sealed so that the internal components of the electronic device are isolated from the external environment. This need is particularly important in portable electronic devices, such as portable electronic test equipment, which may be used in wet or dirty environments.

It is fairly easy to provide an adequate seal for electronic devices housed in a case having only two parts or sections, such as a top part and a bottom part. Two-part cases can be fabricated with a resilient gasket positioned between opposed marginal edges. The two parts are then drawn toward each other, thereby compressing the gasket between the opposed marginal edges.

Although the above-described technique works well for most two-part electronic device cases, it does not always work well for electronic device cases having multiple parts if any part contacts two or more parts of the case. The difficulty arises at the locations where three or more parts of the case join each other and one of the parts crosses over a gasket positioned between two other parts. Under these circumstances, there may be a gap where a gasket positioned between two of the parts extends over a gasket that is positioned between a third part and one or both of the two parts. As a result, it has heretofore been difficult to effectively seal many three-part electronic device cases from the external environment.

It would be possible to effectively seal multiple part electronic device cases despite the presence of a junction between three or more parts by using a single gasket having multiple branches or loops so that there could not be a gap where one part of the cases bridges the junction between two other parts of the case. However, it would be very difficult and hence expensive to manufacture complex seals having multiple branches or loops. Moreover, such seals would have very little versatility because they could no longer be used after a change was made to any one of the multiple parts of the case.

SUMMARY OF THE INVENTION

The primary object of the present invention is to provide an effective and relatively inexpensive system for sealing a multiple part electronic device case in which one of the parts bridges the junction between two or more other parts.

These and other objects of the invention are provided by a system for sealing an electronic instrument case having three or more parts. The case includes first and second parts each of which have opposed marginal edges at each side and a substantially open end. The case further includes an end plate covering the open ends of the first and second case parts. As a result, the end plate bridges a junction between the first and second parts at each side of the case. A first gasket is positioned between the opposed side marginal edges of the first and second case parts. A second gasket is positioned between and contacts the end plate and the first and second case parts so that the second gasket crosses over the first gasket where the second gasket bridges the junction between the first and second parts. In order to ensure effective sealing, the second gasket makes contact with the first gasket when it crosses over the first gasket. Thus, the first gasket seals the junction between the first and second parts, the second gasket seals the junction between the end plate and the first and second case parts, and the combination of the first and second gaskets seal the junction where the end plate bridges the first and second parts.

The second gasket preferably includes a pair of integrally formed fingers each of which projects toward and contacts the first gasket at a respective side of the case to ensure continuous contact between the first and second gaskets. The fingers are preferably positioned between the first gasket and the side marginal edge of the first case part.

The open ends of the first and second parts are preferably defined by respective end marginal edges, and the second gasket is positioned between and contacts the end plate and the end marginal edges of the first and second case parts. The end marginal edges of the first and second parts may include an inwardly extending flange between which the first gasket is positioned. The second gasket may then be in the form of a generally U-shaped gasket receiving the inwardly extending flange. The U-shaped gasket is preferably received in a generally U-shaped channel formed along the marginal edge of the end plate.

In another aspect of the invention, the first gasket is of resilient material and is bonded to the side marginal edges of the first case part. Respective projecting ridges preferably extend along the side marginal edges of the second case part and compress the first gasket to locally increase the resilient force between the first gasket and the side marginal edges of the second part.

In still another aspect of the invention, the side marginal edges of the first part are recessed within sidewalls of the first part by a first distance that is greater than the thickness of the first gasket, and the side marginal edges of the second case part project beyond sidewalls of the second case part by a distance that is greater than the first distance. As a result, the first gasket is enclosed by sidewalls of the first part.

BRIEF DESCRIPTION OF THE DRAWINGS

FIG. 3 is a cross-sectional view taken along the line 3—3 of FIG. 1.

FIG. 4 is a cross-sectional view taken along the line 4—4 of FIG. 1.

FIG. 5 is a cross-sectional view taken along the line 5—5 of FIG. 1 except that the electronic instrument case is shown without one component of the inventive sealing system present for the purpose of illustrating one of the problems solved by the present invention.

FIG. 6 is a cross-sectional view taken along the line 6—6 of FIG. 1.

DETAILED DESCRIPTION OF THE INVENTION

Figure 1:
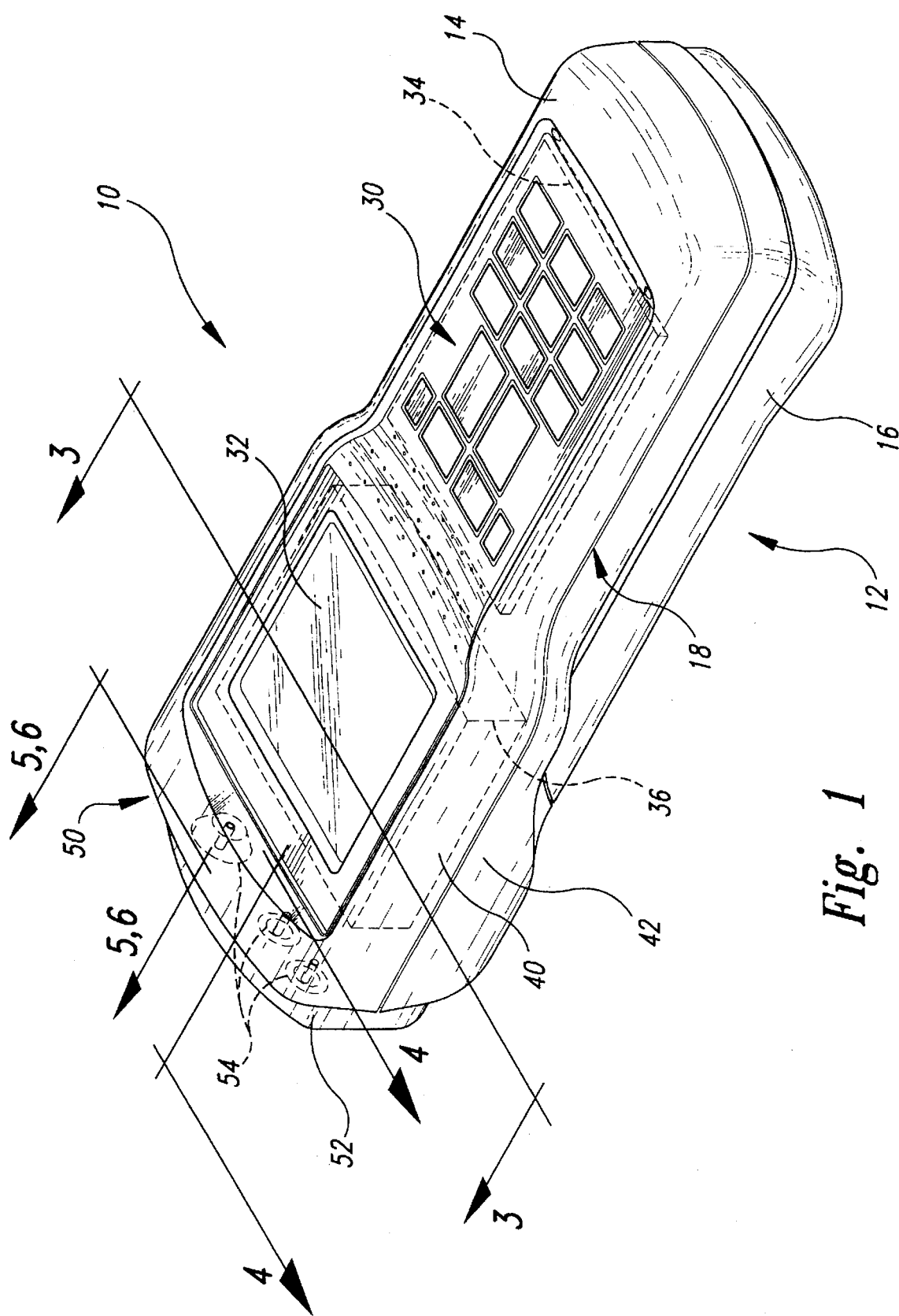
FIG. 1 is an isometric view of an electronic device packaged in a three-part electronic instrument case using the preferred embodiment of the inventive sealing system.

One embodiment of an electronic device 10 using the inventive sealing system is illustrated in FIG. 1. The device 10 is a portable electronic test and measurement instrument having a case 12 divided into respective top and bottom parts 14, 16 that adjoin each other at a horizontal junction 18. The top part 14 of the case 12 contains a keyboard 30 and a display 32 for providing a convenient user interface. The keyboard 30 and display 32 communicate with a circuit board 34 containing electronic components 36. The keyboard 30, display 32, circuit board 34, and electronic components 36 are conventional and they are connected to each other in a conventional manner and thus will not be explained in detail herein. The top part 14 of the case 12 has a pair of sidewalls 40, and the bottom part of the case 12 has a pair of sidewalls 42.

One end 50 of the top and bottom parts 14, 16 is open and is covered by an end plate 52 having connectors 54 for connecting to various test leads (not shown).

Figure 2:
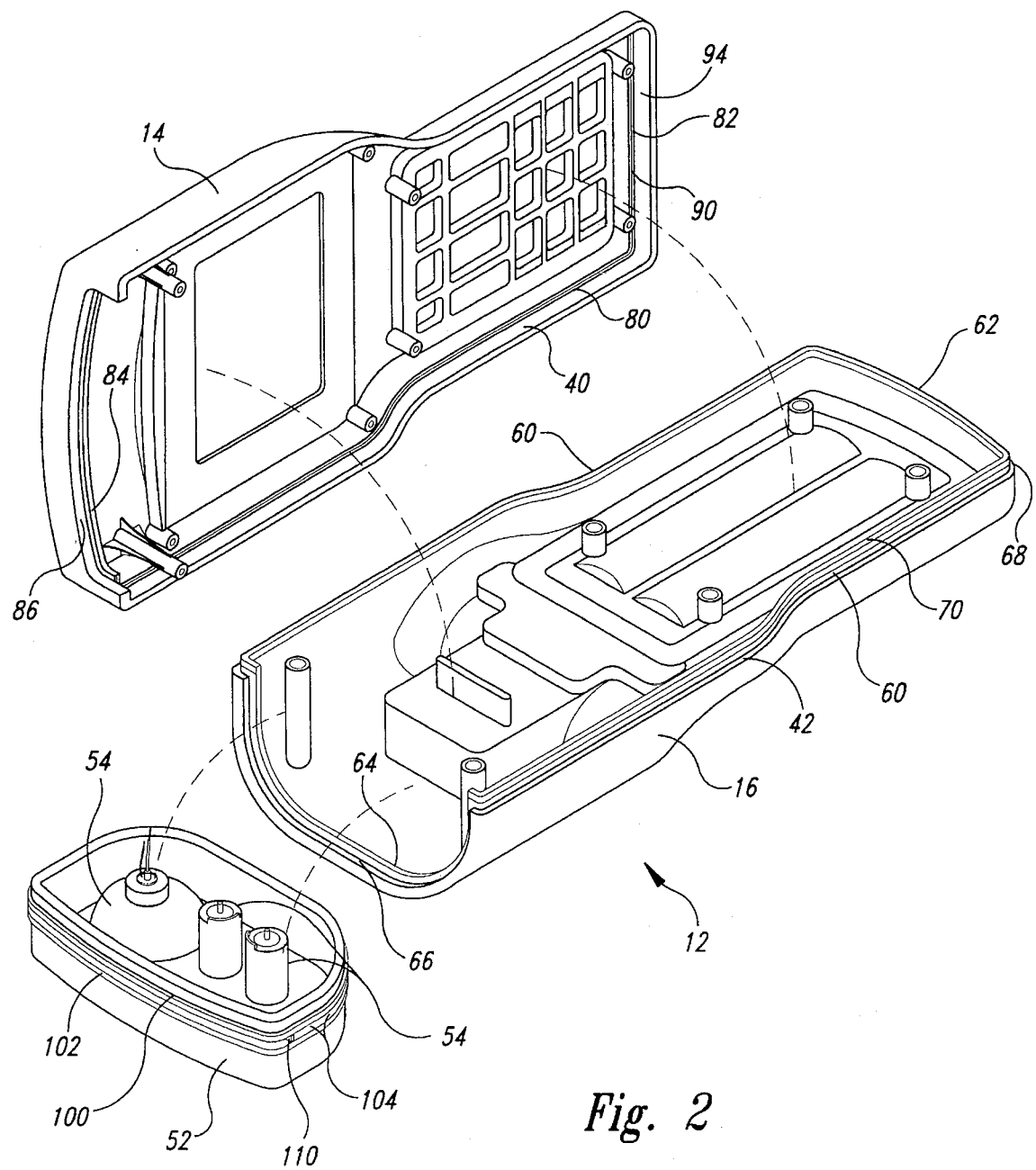
FIG. 2 is an exploded isometric view of the electronic instrument case of FIG. 1.

The individual parts of the case 12 can be better seen with reference to FIG. 2. The bottom part 16 of the case 12 has side marginal edges 60 on opposite sides and an end marginal edge 62 between the side marginal edges 60. The ends of the side marginal edges 60 bend inwardly at 90 degrees to join a flange 64 extending along an end marginal edge 66 of the bottom part 16.

A gasket 70 of elastomeric material extends continuously from one side of the flange 64, along one side marginal edge 60, along the end marginal edge 62, and back along the other side marginal edge 60 to the other side of the flange 64. The side marginal edges 60 and end marginal edge 62 position the gasket 70 so that it projects beyond the sidewalls 42 and an endwall 68 to allow the gasket 70 to be enclosed as explained below. The gasket 70 is preferably bonded to the side marginal edges 60 and the end marginal edge 62 by suitable means. However, a gasket not bonded to either part 14, 16 of the case 12 may also be used.

The top part 14 of the case 12, like the bottom part 16, has side marginal edges 80 on opposite sides of an end marginal edge 82. The ends of the side marginal edges 80 bend inwardly at 90 degrees to join a flange 84 extending along an end marginal edge 86 of the top part 14.

The side marginal edges 80 and end marginal edge 82 has formed thereon a continuous ridge 90. As explained below, when the top part 14 and the bottom part 16 are positioned together as illustrated in FIG. 1, the upper surface of the gasket 70 contacts the side marginal edges 80 and end marginal edge 82 of the top part 14, as best illustrated in FIG. 3. The ridge 90 further compresses the gasket 70 to increase the compressive force between the marginal edges 80, 82 along the ridge 90, thereby providing a better seal between the top and bottom parts 14, 16, respectively.

As also shown in FIGS. 2 and 3, the side marginal edges 80 of the top part 14 are recessed within the sidewalls 40 of the top part 14. Similarly, the end marginal edge 82 of the top part 14 is recessed within an endwall 94 of the top part 14. The marginal edges 80, 82 are recessed within the walls 40, 94 by a sufficient distance that, when the top part 14 is placed against the bottom part 16 as shown in FIG. 1, the portion of the top sidewalls 40, and end wall 94 extending beyond the top marginal edges 80, 82 overlie the gasket 70, as best illustrated in FIG. 3. The sidewalls 80 and end wall 94 thus protect the gasket from being damaged by foreign objects to insure the integrity of the sealing provided by the gasket 70.

With further reference to FIG. 2, the edge of the end plate 52 has formed therein a generally U-shaped channel 100 which receives a correspondingly shaped and dimensioned U-shaped gasket 102. A groove 104 formed in the center of the gasket 102 receives the flanges 64, 84 of the bottom part 16 and top part 14 of the case 12, respectively, as best illustrated in FIG. 4. The interfit between the flanges 64, 84 and the groove 104 holds end plate 52 in position in the open ends of the top part 14, and bottom part 16 of the case 12. Furthermore, the end plate 52 is preferably dimensioned so that the gasket 102 is compressed slightly to allow the gasket 102 to provide a better seal.

The gaskets 70, 102 are highly effective in sealing the interior of the case 12 from the external environment as long as there is no location in which one part of the case 12 crosses over the junction between two other parts of the case 12. However, as best illustrated in FIGS. 2 and 5, the end plate 52 must cross the junction 18 between the top part 14 and the bottom part 16 of the case 12 at each side of the case 12. When the end plate 52 crosses the junction 18 between the top part 14 and the bottom part 16, the gasket 70 crosses over the gasket 102. This structure may create a weak spot in the sealing function provided by the gaskets 70, 102 because generally there will not be any force between the gaskets 70, 102 where they cross over each other. As a result moisture, dirt and other foreign substances may find their way into the interior of the case 12. This problem of a loss in sealing integrity where three or more case parts join each other and gaskets must cross over each other has not generally been recognized.

One solution to the above-described sealing integrity problem is illustrated in FIG. 6 which is identical to FIG. 5 except that the gasket 102 is provided with an integrally formed, outwardly extending finger 110 on each side of the case 12. As best shown in FIG. 6, the fingers 110 are positioned between the side marginal edges 80 of the top part 14 and the gasket 70 with the ends of the fingers 110 contacting the ridge 90 formed on the surface of the top part 14 side marginal edges 80. As a result, the fingers 110 of the gasket 102 are compressively loaded by the compression of the gasket 70 when the top part 14 and bottom part 16 are drawn toward each other to ensure a watertight, dustproof seal.

The case 12 should be assembled by first placing the end plate 52 into the open end of the bottom part 16 with the groove 104 formed in the gasket 102 receiving the flange 64 of the bottom part 16. The fingers 110 will then be positioned on the upper surface of the gasket 70. The top part 14 of the case 12 is then placed over the bottom part 16 making sure that the flange 84 of the top part 14 fits into the groove 104 of the gasket 102. The top and bottom parts 14, 16, respectively, are then drawn toward each other by conventional means, such as fasteners (not shown), to compress the gasket 70 between the marginal edges 60, 62 of the bottom part 16 and the marginal edges 80, 82 of the top part 14. At the same time, the fingers 110 are compressed between the gasket 70 and the side marginal edges 80 of the top part 14, and the gasket 102 is compressed between the flanges 64, 84 and the bottom of the U-shaped channel 100 formed along the edge of the end plate 52.

The sealing structure shown in FIG. 6 may be altered as desired, such as by bonding the seal 70 to the top part 14 marginal edges 80 and placing the fingers 110 between the seal 70 and the bottom part 16 marginal edges 60. In the event that a seal 70 is used that is not bonded to either side marginal edges 60 or 80, two fingers 110 may be used at each side of the case 12 so that one finger 110 can be positioned between the seal 70 and the top part 14 side marginal edge 80 and another finger 110 can be positioned between the seal 70 and the bottom part 16 side marginal edge. Also, although less desirable, the finger 110 may intersect the center of the gasket 70 so that it is not contacting either marginal edge 60 or 80. Other modifications will be apparent to one skilled in the art without departing from the scope of the following claims.

We claim:

1. A system for sealing an electronic instrument case from the external environment, said case having a first part having marginal edges at each side and a substantially open end, a second part having marginal edges at each side and a substantially open end, the second case part being shaped and dimensioned so that the side marginal edges of said second case may be positioned opposite the corresponding side marginal edges of said first case part, said electronic instrument case further including an end plate covering the open ends of said first and second case parts, said sealing system comprising:

a first gasket positioned between the opposed side marginal edges of said first and second case parts; and a second gasket positioned between and contacting said end plate and said first and second case parts, said second gasket further contacting said first gasket at each side of the first and second case parts so that said first gasket seals a junction between said first and second case parts, said second gasket seals a junction between said end plate and said first and second case parts, and the combination of said first and second gaskets seal a junction between said end plate, said first case part, and said second case part at each side of said case.

2. The environmental sealing system of claim 1 wherein said first and second parts have respective end marginal edges defining the substantially open ends of said first and second parts, and wherein said second gasket is positioned between and contacts said end plate and the end marginal edges of said first and second case parts.

3. The environmental sealing system of claim 2 wherein the end marginal edges of said first and second case parts include an inwardly extending flange between which said first gasket is positioned, wherein said end plate has a marginal edge in which a generally U-shaped channel is formed, wherein said second gasket is positioned within said channel, and wherein said channel receives the inwardly extending flanges of said first and second case parts so that edges of said flange and said first gasket abut said second gasket within said channel.

4. The environmental sealing system of claim 1 wherein said second gasket includes a pair of integrally formed fingers each of which projects toward and contacts said first gasket at a respective side of said case.

5. The environmental sealing system of claim 4 wherein each of said fingers is positioned between said first gasket and the side marginal edge of said first case part.

6. The environmental sealing system of claim 4 wherein said first and second parts have respective end marginal edges defining the substantially open ends of said first and second parts, wherein said end plate has a marginal edge in which a generally U-shaped channel is formed, wherein said second gasket is positioned within said channel with said projecting fingers extending into said channel, and wherein said channel receives an inwardly extending flanges of said first and second case parts so that edges of said flange and said first gasket abut said second gasket within said channel.

7. The environmental sealing system of claim 1 wherein said first gasket is of resilient material and is bonded to the side marginal edges of said first case part, and wherein respective projecting ridges extend along the side marginal edges of said second case part, said ridges extending into and compressing said first gasket to locally increase the resilient force between said first gasket and the side marginal edges of said second case part along said ridge.

8. The environmental sealing system of claim 1 wherein the side marginal edges of said first case part are recessed within sidewalls of said first case part by a first distance that is greater than the thickness of said first gasket, and wherein the side marginal edges of said second case part project beyond sidewalls of said second case part by a distance that is greater than said first distance so that said first gasket is enclosed by sidewalls of said first case part.

9. The environmental sealing system of claim 1 wherein the marginal side edges of said first case part gasket are stepped so that a first portion of said side marginal edges extend beyond a second portion of said side marginal edges, and wherein one edge of said first gasket is stepped to match the step of the first marginal side edges of said first case part, said first gasket being positioned on the side marginal edges of said first case part so that the respective steps of said side marginal edges and said first gasket interfit with each other.

10. An environmentally sealed electronic test instrument, comprising:

an electronic testing circuit;

a top case part having marginal edges at each side and a substantially open end defined by an end marginal edge;

a bottom case part having marginal edges at each side and a substantially open end defined by an end marginal edge, the bottom case part being shaped and dimensioned so that the side marginal edges of said bottom case part may be positioned opposite the corresponding side marginal edges of the top case part to enclose said electronic testing circuit;

an end plate covering the open ends of said top and bottom case parts;

a first gasket positioned between the opposed side marginal edges of said top and bottom case parts; and a second gasket positioned between and contacting said end plate and the end marginal edges of said top and bottom case parts, said second gasket further contacting said first gasket at each side of the top and bottom case parts so that said first gasket seals a junction between said top and bottom case parts, said second gasket seals a junction between said end plate and said top and bottom case parts, and the combination of said first and second gaskets seal a junction between said end plate, said top case part, and said bottom case part at each side of said case.

11. The environmentally sealed electronic test instrument of claim 10 wherein said second gasket includes a pair of integrally formed fingers each of which projects toward and contacts said first gasket at a respective side of said top and bottom case parts.

12. The environmentally sealed electronic test instrument of claim 11 wherein each of said fingers is positioned between said first gasket and the side marginal edge of one of said top and bottom case parts.

13. The environmentally sealed electronic test instrument of claim 12 wherein the end marginal edges of said top and bottom case parts include an inwardly extending flange between which said first gasket is positioned, wherein said end plate has a marginal edge in which a generally U-shaped channel is formed, wherein said second gasket is positioned within said channel with said projecting fingers extending into said channel, and wherein said channel receives the inwardly extending flanges of said top and bottom case parts so that edges of said flange and said first gasket abut said second gasket within said channel.

14. The environmentally sealed electronic test instrument of claim 10 wherein the end marginal edges of said top and bottom case parts include an inwardly extending flange between which said first gasket is positioned, wherein said end plate has a marginal edge in which a generally U-shaped channel is formed, wherein said second gasket is positioned within said channel, and wherein said channel receives an inwardly extending flanges of said top and bottom case parts so that edges of said flange and said first gasket abut said second gasket within said channel.

15. The environmentally sealed electronic test instrument of claim 10 wherein said first gasket is of resilient material and is bonded to the side marginal edges of one of said top and bottom case parts, and respective projecting ridges extend along the side marginal edges of the other of said top and bottom case parts, said ridges extending into and compressing said first gasket to increase the resilient force between said first gasket and the side marginal edges of the other of said top and bottom case parts along said ridge.

16. The environmentally sealed electronic test instrument of claim 10 wherein the side marginal edges of one of said top and bottom case parts are recessed within sidewalls of said one case part by a first distance that is greater than the thickness of said first gasket, and wherein the side marginal edges of the other of said top and bottom case parts project beyond sidewalls of said other case part by a distance that is greater than said first distance so that said first gasket is enclosed by sidewalls of said one case part.

17. A method of sealing first and second co-planar walls having opposed edges that extend along a first line and a third wall that is perpendicular to said first and second walls and is positioned adjacent said first and second walls along a second line that is perpendicular to said first line, said method comprising:

placing a first gasket between said first and second walls with said gasket extending along said first line; and placing a second gasket between said third wall and said first and second walls with said second gasket extending along said second line, one of said gaskets having integrally formed therein a finger projecting from said one gasket toward and in contact with the other of said gaskets.

18. The method of claim 17 wherein said first and second walls terminate at respective edges that lie in said second line so that the edges of said first and second walls abut said third wall.

19. The method of claim 18 wherein said second gasket extends along an edge of said third wall, wherein said first and second walls and said first gasket extend along said first line until approaching said second line and then bend by substantially 90 degrees to abut said second gasket, and wherein said finger projects in the plane of said third wall toward and against said first gasket.

20. The method of claim 19 wherein said finger is positioned between said first gasket and the side marginal edge of said first wall.

21. The method of claim 17 further including a fourth wall projecting from said first wall in a plane that is parallel to the plane of said first wall, said fourth wall extending along the length of said first gasket and being offset from said first wall in a direction perpendicular to said first wall, said fourth wall projecting from said first wall a sufficient distance so that said fourth wall overlies said first gasket.

* * * * *